(12) United States Patent
Oshiro

(10) Patent No.: US 8,765,026 B2
(45) Date of Patent: Jul. 1, 2014

(54) TABLET FOR VAPOR DEPOSITION AND METHOD FOR PRODUCING THE SAME

(75) Inventor: Azusa Oshiro, Tokyo (JP)

(73) Assignee: Sumitomo Metal Mining Co., Ltd., Tokyo (JP)

(*) Notice: Subject to any disclaimer, the term of this patent is extended or adjusted under 35 U.S.C. 154(b) by 0 days.

(21) Appl. No.: 13/386,118

(22) PCT Filed: Jun. 17, 2010

(86) PCT No.: PCT/JP2010/060698
§ 371 (c)(1),
(2), (4) Date: Jan. 20, 2012

(87) PCT Pub. No.: WO2011/016297
PCT Pub. Date: Feb. 10, 2011

(65) Prior Publication Data
US 2012/0241696 A1    Sep. 27, 2012

(30) Foreign Application Priority Data

Aug. 7, 2009   (JP) ................................. 2009-184177
Feb. 24, 2010  (JP) ................................. 2010-038318

(51) Int. Cl.
*H01B 1/02*      (2006.01)
*H01B 1/08*      (2006.01)

(52) U.S. Cl.
USPC ....................................................... 252/518.1

(58) Field of Classification Search
USPC ................................. 252/501.1, 518.1, 520.1
See application file for complete search history.

(56) References Cited

U.S. PATENT DOCUMENTS

2010/0108951 A1    5/2010   Hasegawa

FOREIGN PATENT DOCUMENTS

| CN | 101114719 | * | 1/2008 |
|---|---|---|---|
| EP | 2336386 A1 | | 6/2011 |
| JP | 8-260134 | | 10/1996 |
| JP | 11-100660 | | 4/1999 |
| JP | 2006-117462 A1 | | 5/2006 |
| JP | 2007-112673 | * | 5/2007 |
| JP | 2008-1554 | | 1/2008 |
| JP | 2008-192604 A1 | | 8/2008 |

OTHER PUBLICATIONS

International Search Report for International Application No. PCT/JP2010/060698 dated Jul. 20, 2010.
Supplementary European Search Report dated Jun. 6, 2013, in counterpart European Application No. 10806297.7.

* cited by examiner

*Primary Examiner* — Mark Kopec
*Assistant Examiner* — William Young
(74) *Attorney, Agent, or Firm* — Kratz, Quintos & Hanson, LLP

(57) ABSTRACT

A tablet for vapor deposition characterized in that on a fracture surface of an indium oxide sintered body, the percentage of crystal grains having a grain diameter corresponding to a highest peak is 20% or less. The tablet is produced by: mixing indium oxide powder and cerium oxide powder, and subjecting the mixture to a heat treatment at 1300° C. to 1550° C. to calcine; mixing an uncalcined indium oxide powder and/or an uncalcined cerium oxide powder with the obtained calcined powder such that the ratio of the calcined powder is 50% to 80% by mass, followed by granulation; and molding the obtained granulated powder, thereby forming a molded body, and then sintering the molded body at a temperature which is 1100° C. to 1350° C., and which is lower than the temperature of the heat treatment on the calcined powder in the first step by 20° C. or more.

13 Claims, 4 Drawing Sheets

TABLET FOR VAPOR DEPOSITION AND METHOD FOR PRODUCING THE SAME

TECHNICAL FIELD

The present invention relates to a material for vapor deposition made of an oxide sintered body for use in producing a low-resistance transparent conductive film by a vacuum vapor deposition method, and particularly to a tablet for vapor deposition for use in forming a high-refractive-index transparent conductive film having a refractive index as high as 2.0 to 2.2 by a vacuum vapor deposition method, and a method for producing the tablet for vapor deposition.

BACKGROUND ART

Transparent conductive films generally have high electrical conductivities and high transmittances in the visible light region. For these reasons, transparent conductive films are used as electrodes and the like for solar cells, liquid crystal display device, and other various light receiving devices, and also used as heat ray reflection films for automobile windows or building use, antistatic films, transparent heating members for preventing fog on freezer showcases or the like.

For the above-described applications, tin oxide containing antimony or fluorine as a dopant, zinc oxide containing aluminum or gallium as a dopant, indium oxide containing tin as a dopant, and the like have been used widely. In particular, films of indium oxide containing tin as a dopant, i.e., $In_2O_3$—$SnO_2$-based films are called ITO (Indium tin oxide) films, and have been widely used so far, particularly because low-resistance films can easily be obtained.

In addition to electrical conductivity and transmittance, refractive index is also regarded as important, when a transparent conductive film is used as a part of a stacked film such as an optical film. Cerium oxide and titanium oxide have been generally used as high-refractive-index materials, but have poor electrical conductivities. Hence, when an electrical conductivity is required, the above-described cerium oxide or titanium oxide added to indium oxide or the like to provide an electrical conductivity is used.

Here, materials for vapor deposition for use in forming transparent conductive films by a vacuum vapor deposition method are broadly classified into two types; one is a material for vapor deposition made of particles each having a size of 5 mm less in diameter; the other is a tablet-shaped material having, for example, a diameter of about 30 mm and a height of about 10 mm.

Here, a vacuum vapor deposition method using the tablet-shaped material for vapor deposition (a tablet for vapor deposition) has the following problems. Specifically, when a tablet having a too-low density is irradiated with electron beams, the sintering of the tablet occurs rapidly, simultaneously with the evaporation of the material from the surface. As a result, the tablet partially shrinks, so that the tablet is broken. On the other hand, when a tablet having a too-high density is irradiated with electron beams, a difference in temperature is created between the surface and the inside of the tablet. As a result, breakage of the tablet (breakage due to thermal shock) occurs because of difference in thermal expansion. The occurrence of the breakage of the tablet makes it impossible to perform continuous film formation because of clogging of an apparatus with fragments, or results in deterioration in film qualities because nonuniform irradiation with the electron beams leads to variations in film formation conditions. Here, the deterioration in film qualities means deterioration in film thickness distribution and resistance distribution.

In this respect, in order to solve the above-described problems, a method is proposed for an ITO tablet for vapor deposition (also referred to as an ITO pellet for vapor deposition). In this method, an ITO sintered body having a relative density of 90% or more is crushed, and the obtained granules having grain diameters of 0.5 mm or less is sintered again, so that an ITO tablet having a relative density of 50% to 80%, both inclusive, is obtained (see Patent Document 1: Japanese Patent Application Publication No. Hei 11-100660).

Note that, the "relative density" refers to the ratio (%) of the density of a sintered body (a material for vapor deposition) to the calculated true density determined from true densities of mixed powders, which are starting materials of the material for vapor deposition, and is a value determined from the formula: (density of sintered body/calculated true density)×100=relative density of sintered body (%). In the case of ITO, the "calculated true density" is calculated as follows: calculated true density=100/{[ratio of indium oxide blended (% by mass)/true density of indium oxide]+[ratio of tin oxide blended (% by mass)/true density of tin oxide]}.

Meanwhile, for zinc oxide-based tablets doped with gallium or the like, a method is proposed in which the density of a sintered body is adjusted by using a powder calcined in advance as a part of a raw material powder (see Patent Document 2: Japanese Patent Application Publication No. 2006-117462).

Here, an attempt to produce a sintered body tablet of an indium oxide containing cerium as a dopant (hereinafter sometimes abbreviated as an ICO) by use of the method proposed in Patent Document 1 results in a problem that an ICO sintered body tablet having a relative density of 90% or more is difficult to crush because the ICO sintered body has a higher hardness than the above-described ITO sintered body. In addition, even when the ICO sintered body is crushed into a powder by some means, there is another problem that, in an attempt to mold the obtained powder into a tablet shape by pressing, the shape of the molded body cannot be retained, and the molded body is easily broken, because of poor collapsibility of the powder.

Meanwhile, with reference to the method proposed in Patent Document 2, it is made possible to produce an ICO sintered body tablet having a relative density of 50% to 80%, both inclusive, by using a calcined powder obtained by calcinating a powder mixture containing an indium oxide powder and a tin oxide powder and also using a powder obtained by mixing an uncalcined indium oxide powder and an uncalcined cerium oxide powder. However, there is a problem that the tablet is cracked during electron beam deposition, even though the relative density is 50% to 80%, both inclusive.

The present invention has been made with attention focused on these problems. An object of the present invention is to provide a tablet for vapor deposition which is made of an indium oxide sintered body containing cerium as a dopant, and which is not broken even when irradiated with high-power electron beams, and to provide a method for producing the tablet for vapor deposition.

DISCLOSURE OF THE INVENTION

In this respect, in order to achieve the above-described object, the present inventors have further modified the method of Patent Document 2 in which a powder calcined in advance is used as a part of a raw material powder. As a result, the present inventors have found that, when an ICO sintered body tablet having a relative density of 50% to 80%, both inclusive, is produced under a condition of a sintering temperature lower than a calcination temperature by 200° C. or more, the breakage of the ICO sintered body tablet is less frequent, even when the obtained ICO sintered body tablet is irradiated with high-power electron beams.

In addition, an observation performed on the distribution of crystal grains appearing on a fracture surface of the ICO sintered body tablet having a relative density of 50% to 80%, both inclusive, and being produced under the condition of a sintering temperature which is lower than the calcination temperature by 200° C. or more showed that the distribution was moderate and ranges from large crystal grains to small crystal grains, and that the ratio of crystal grains with any specific grain diameter was low. Moreover, it was shown that a distribution of crystal grain amounts each obtained by multiplying the number of the crystal grains with a grain diameter of the crystal grains was such that the percentage (defined as a most frequent crystal grain percentage) due to crystal grains having a grain diameter corresponding to a highest peak was 20% or less. The present invention has been completed on the basis of such technical findings.

Specifically, a tablet for vapor deposition according to the present invention is a tablet for vapor deposition which is made of an indium oxide sintered body containing cerium as a dopant, and which has a relative density of 50% to 80%, both inclusive, the tablet for vapor deposition characterized in that crystal grains appearing on a fracture surface of the indium oxide sintered body have such a distribution of crystal grain amounts that the percentage (defined as most frequent crystal grain percentage) due to crystal grains having a grain diameter corresponding to a highest peak is 20% or less, each of the crystal grain amounts being obtained by multiplying the number of crystal grains with a grain diameter of the crystal grains.

Next, the tablet for vapor deposition of the present invention having a most frequent crystal grain percentage of 20% or less is produced by the following "first production method" or "second production method."

Specifically, the first production method according to the present invention is characterized by comprising:

a first step of obtaining a calcined powder by subjecting an indium oxide powder to a heat treatment at 1300° C. or above and 1550° C. or below;

a second step of obtaining a granulated powder by mixing an uncalcined cerium oxide powder or an uncalcined indium oxide powder and an uncalcined cerium oxide powder with the obtained calcined powder such that the ratio of the calcined powder is 50% by mass to 80% by mass, both inclusive, followed by granulation; and a third step of obtaining an indium oxide sintered body containing cerium as a dopant by molding the obtained granulated powder, thereby forming a molded body, and then sintering the molded body at a temperature which is 1100° C. or above and 1350° C. or below, and which is lower than the temperature of the heat treatment on the calcined powder in the first step by 200° C. or more.

Meanwhile, the second production method according to the present invention is characterized by comprising:

a first step of obtaining a calcined powder by subjecting an indium oxide powder and a cerium oxide powder to a heat treatment at 1300° C. or above and 1550° C. or below;

a second step of obtaining a granulated powder by mixing an uncalcined indium oxide powder and/or an uncalcined cerium oxide powder with the obtained calcined powder such that the ratio of the calcined powder is 50% by mass to 80% by mass, both inclusive, followed by granulation; and a third step of obtaining an indium oxide sintered body containing cerium as a dopant by molding the obtained granulated powder, thereby forming a molded body, and then sintering the molded body at a temperature which is 1100° C. or above and 1350° C. or below, and which is lower than the temperature of the heat treatment on the calcined powder in the first step by 200° C. or more.

The ICO sintered body tablet for vapor deposition of the present invention obtained by any of the above-described production methods are not easily broken by irradiation with high-power electron beams. Hence, it is possible to produce a high-refractive-index transparent conductive film having a refractive index as high as 2.0 to 2.2.

BEST MODES FOR PRACTICING THE INVENTION

Hereinafter, embodiments of the present invention are described in detail.

First, an ICO sintered body tablet for vapor deposition according to the present invention is characterized in that crystal grains appearing on a fracture surface of the ICO sintered body have such a distribution of crystal grain amounts that the percentage (defined as most frequent crystal grain percentage as described above) due to crystal grains having a grain diameter corresponding to a highest peak is 20% or less, each of the crystal grain amounts being obtained by multiplying the number of crystal grains with a grain diameter of the crystal grains.

Here, the "most frequent crystal grain percentage" can be determined from a SEM image of a fracture surface of the ICO sintered body tablet as follows.

Figure 2:
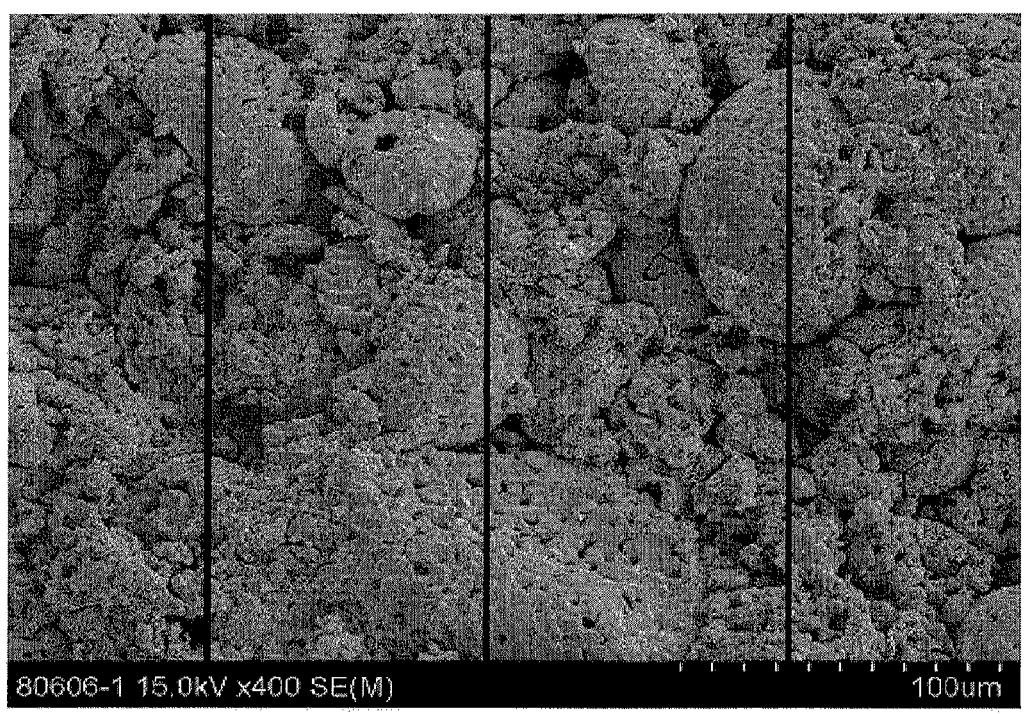
FIG. 2 is a SEM (scanning electron microscope) image of a fracture surface of an ICO sintered body tablet for vapor deposition according to Example 1.

First, for example, three parallel straight lines are drawn at any positions on a SEM image (a SEM image of a fracture surface of an ICO sintered body tablet for vapor deposition according to Example 1 is taken as a reference) shown in FIG. 2. Then, lengths defined by grain boundary portions of crystal grains positioned on any of the three straight lines are measured as "grain diameters of crystal grains (crystal grain diameters)."

Next, a range of the grain diameters is sectioned at intervals of 0.34 μm, and "the number of crystal grains" in each of the sections at the 0.34-μm intervals is counted.

Next, with the "center value" of each of the sections being used as a representative value of the "grain diameters of crystal grains (crystal grain diameters)" in the section, a value obtained by multiplying the "number of crystal grains" with the "crystal grain diameter (center value)" is defined as a "crystal grain amount."

Then, the "crystal grain amount" is determined for each of the sections, and the percentage of each of the "crystal grain amounts" relative to the total of the "crystal grain amounts" is calculated. In addition, the percentage due to crystal grains having a grain diameter corresponding to a highest peak is determined as the above-described "most frequent crystal grain percentage."

Next, the ICO sintered body tablet for vapor deposition of the present invention is manufactured by the following "first production method" or "second production method."

First, the first production method is characterized by comprising:

a first step of obtaining a calcined powder by subjecting an indium oxide powder to a heat treatment at 1300° C. or above and 1550° C. or below;

a second step of obtaining a granulated powder by mixing an uncalcined cerium oxide powder or an uncalcined indium oxide powder and an uncalcined cerium oxide powder with the obtained calcined powder such that the ratio of the calcined powder is 50% by mass to 80% by mass, both inclusive, followed by granulation; and a third step of obtaining an indium oxide sintered body containing cerium as a dopant by molding the obtained granulated powder, thereby forming a molded body, and then sintering the molded body at a temperature which is 1100° C. or above and 1350° C. or below, and which is lower than the temperature of the heat treatment on the calcined powder in the first step by 200° C. or more.

Meanwhile, the second production method is characterized by comprising:

a first step of obtaining a calcined powder by subjecting an indium oxide powder and a cerium oxide powder to a heat treatment at 1300° C. or above and 1550° C. or below;

a second step of obtaining a granulated powder by mixing an uncalcined indium oxide powder and/or an uncalcined cerium oxide powder with the obtained calcined powder such that the ratio of the calcined powder is 50% by mass to 80% by mass, both inclusive, followed by granulation; and a third step of obtaining an indium oxide sintered body containing cerium as a dopant by molding the obtained granulated powder, thereby forming a molded body, and then sintering the molded body at a temperature which is 1100° C. or above and 1350° C. or below, and which is lower than the temperature of the heat treatment on the calcined powder in the first step by 200° C. or more.

Hereinafter, each of the steps is described specifically.

(First Step: Calcined Powder)

In the "first production method" according to the present invention, a calcined powder is obtained by subjecting an indium oxide powder to a heat treatment at 1300° C. or above and 1550° C. or below. Meanwhile, in the "second production method" according to the present invention, a calcined powder is obtained by subjecting an indium oxide powder and a cerium oxide powder to a heat treatment at 1300° C. or above and 1550° C. or below. Note that a calcination temperature lower than 1300° C. is disadvantageous in that the density and the size of a target ICO sintered body vary greatly. Meanwhile, a calcination temperature exceeding 1550° C. is not preferable because the powder is rigidly sintered during the calcination, so that it becomes difficult to obtain a powder by crushing the rigidly sintered powder after the calcination. Accordingly, the calcination temperature is 1300° C. or above and 1550° C. or below, and more preferably 1400° C. to 1500° C., and a calcination time is preferably 15 hours or more.

Note that, as for the powder mixture to be calcined in the "second production method," it is preferable to obtain the powder mixture by mixing an indium oxide powder and a cerium oxide powder; adding a dispersing agent, water, and, if necessary, a binder thereto; performing wet blending by use of a bead mill or a ball mill, and then performing spray drying by use of a spray dryer. This is because the composition of the powder becomes uniform, so that variation in composition in the tablet after the sintering is reduced.

(Second Step: Granulated Powder)

Next, in the "first production method," an uncalcined cerium oxide powder or an uncalcined indium oxide powder and an uncalcined cerium oxide powder are blended with the calcined powder obtained in the first step such that a desired composition is obtained, whereas, in the "second production method," an uncalcined indium oxide powder and/or an uncalcined cerium oxide powder are blended with the calcined powder obtained in the first step such that a desired composition is obtained. Then, these powders are mixed with each other, and granulated by use of a spray dryer to thereby obtain a granulated powder.

Here, the calcined powder and the uncalcined powder are blended with each other such that the calcined powder accounts for 50% by mass to 80% by mass, both inclusive, preferably 70 to 80% by weight. The addition of the calcined powder sufficiently shrunk by the calcination in advance at 50 to 80% by mass relative to all the powders enables the shrinkage during the sintering to be controlled, and a sintered body having a desired density to be obtained.

Meanwhile, a method for mixing the calcined powder and the uncalcined powder is preferably mixing with a mixer in which the powders are not easily crushed during the mixing. Moreover, for the mixing, it is preferable to add 1 to 2% by mass of water, binder, a dispersing agent, and stearic acid to function as a lubricant during press molding.

(Third Step: Molding)

Next, a molded body is obtained by molding the granulated powder obtained in the second step of each of the "first production method" and the "second production method." For molding the granulated powder, press molding is employed. In this molding, the size of the tablet is substantially determined during the molding, because the shrinkage by the sintering is controlled by the ratio of the calcined powder blended and setting conditions of the sintering temperature in a later step.

(Third Step: Sintering)

An atmosphere for sintering the molded body may be any of oxygen, air, and vacuum, and sintering in air is most preferable because it is inexpensive.

For the temperature rise, a temperature rise time is preferably about 15 hours over a range where elimination (organic component elimination) of organic components in the molded body is easily performed, for example, a range from room temperature to 500° C., which is a temperature at which the organic component elimination is completed.

The sintering temperature is set to a temperature which is 1100° C. or above and 1350° C. or below, and which is lower than the calcination temperature in the first step by 200° C. or more. Since the sintering is insufficient at lower than 1100° C., the obtained sintered body has low strength, so that cracking or chipping occurs during handling of the sintered body. Moreover, since the shrinkage during sintering is not completed, the variations in density and size are great. Meanwhile, when the sintering temperature is 1100° C. or above and 1350° C. or below, a sintered body having a relative density of 50 to 80% can be obtained. However, if the sintering temperature is not the temperature which is lower than the calcination temperature, i.e., 1300 to 1550° C., by 200° C. or more, cracking occurs during electron beam deposition, although the relative density is within a range from 50 to 80%.

In addition, a holding time for which the sintering temperature is held after the sintering temperature is reached is preferably 15 hours to 25 hours, both inclusive. When the holding time is 15 hours or longer, time sufficient for the soaking in a sintering furnace to be stabilized is secured, and hence the manufacturing is stabilized. Meanwhile, the quality of the obtained product is not improved, even when the holding time exceeds 25 hours. Hence, it is sufficient to hold the sintering temperature for 25 hours at the longest.

Then, a transparent conductive film made of indium oxide containing cerium can be formed on a substrate by use of the ICO sintered body tablet for vapor deposition according to the present invention and by employing specific deposition or ion plating conditions such as a substrate temperature, pressure, and oxygen concentration. The composition of the transparent conductive film obtained by a vapor deposition method or an ion plating method by use of the sintered body tablet of the present invention is the same as the composition of the tablet.

A material of the substrate is not particularly limited, and may be glass, a resin, a metal, a ceramic, or the like. The substrate may be transparent or non-transparent, and a transparent substrate is preferable. In a case of a resin, substrates in various shapes such as a plate shape and a film shape can be used. For example, even those having low melting points of 150° C. or below may be used.

Hereinafter, Examples of the present invention are described more specifically.

Example 1

A cerium oxide powder having an average grain diameter of 0.6 μm was blended with an indium oxide powder having an average grain diameter of 0.4 μm such that the cerium oxide content was 10% by weight. Then, to the blend, 60% by weight of water, 0.5% by weight of a dispersing agent (polycarboxylic acid ammonium salt), and 1.0% by weight of a binder (PVA) were added. Then, the blend was mixed in a ball mill, and a powder before calcination was prepared by use of a spray dryer. After that, a calcined powder was obtained by conducting calcination in the air at 1500° C. for 20 hours.

Next, 80% by weight of the calcined powder was blended with an uncalcined powder obtained by blending a cerium oxide powder with an indium oxide powder such that the cerium oxide content was 10% by weight. Then, 1.0% by weight of the above-described binder, 0.5% by weight of the above-described dispersing agent, and 0.5% by weight of stearic acid (a lubricant) were added thereto. Then, the blend was mixed in a mixer for 18 hours, and a granulated powder was obtained by use of a spray dryer.

Moreover, the obtained granulated powder was molded by use of a uniaxial pressing machine at pressure of 64 kN. Thus, a molded body having a diameter of 32.7 mm and a height of 7.6 mm was obtained. Then, the molded body was sintered.

In the sintering step, the temperature was raised form room temperature to 500° C. over 15 hours, and then raised to 800° C. over 11 hours. After that, the temperature was held at 1300° C. for 20 hours. Thus, an ICO sintered body tablet for vapor deposition was obtained.

The relative density [which can be determined by (density of ICO sintered body tablet/calculated true density)×100, hereinafter the same shall apply] of the obtained ICO sintered body tablet for vapor deposition was 53.5%. No cracking of the tablet was observed during electron beam (EB) deposition. The transparent conductive film had the same composition as that of the tablet. In addition, predetermined film qualities were successfully obtained without any major change in film formation conditions during the production.

Meanwhile, an ICO sintered body tablet for observation (the same as the ICO sintered body tablet for vapor deposition according to Example 1) was produced under the same conditions as those in Example 1. Then, the ICO sintered body tablet for observation was fractured, and a SEM (scanning electron microscope) image of the fracture surface of the tablet was obtained (see FIG. 2). The "most frequent crystal grain percentage" determined from the SEM image by the method described above was 12.4%.

Note that, in the other Examples and Comparative Examples described below, "ICO sintered body tablets for observation" were produced in the same manner as in Example 1, and "most frequent crystal grain percentages" as described above were determined in the same manner as in Example 1.

Tables 1 and 2 show all the "Cerium oxide concentration," "Calcination temperature," "Ratio of calcined powder," "Cerium oxide concentration in calcined powder," "Sintering temperature," "Temperature difference between calcination temperature and sintering temperature," "Relative density," "The presence or absence of crack in tablet after EB deposition," and "Most frequent crystal grain percentage" according to Examples 1 to 15 and Comparative Examples 1 to 8.

Example 2

An ICO sintered body tablet for vapor deposition was obtained in the same manner as in Example 1, except that the ratio of the calcined powder was 60% by weight. Here, the calcination temperature was 1500° C., and the sintering temperature was 1300° C. The obtained ICO sintered body tablet for vapor deposition had a relative density of 55.4%. No cracking of the tablet was observed during the EB deposition. The transparent conductive film had the same composition as that of the tablet. In addition, predetermined film qualities were successfully obtained without any major change in film formation conditions during the production.

Figure 3:
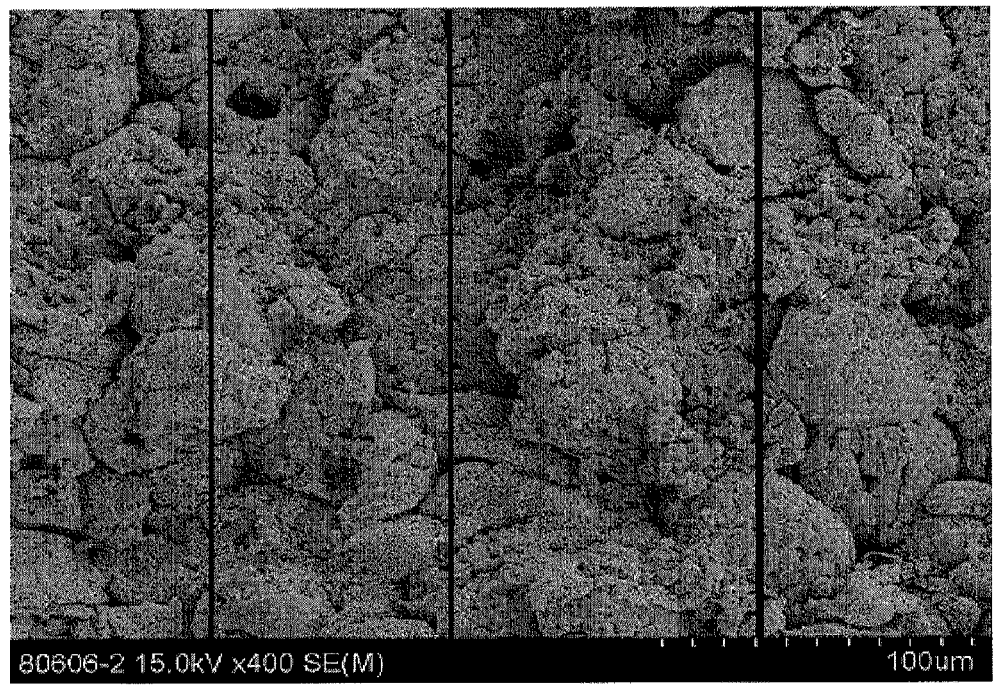
FIG. 3 is a SEM (scanning electron microscope) image of a fracture surface of an ICO sintered body tablet for vapor deposition according to Example 2.

Note that, for reference, a SEM image of a fracture surface of the ICO sintered body tablet for observation according to Example 2 (the same as the ICO sintered body tablet for vapor deposition according to Example 2) is shown in FIG. 3.

Example 3

An ICO sintered body tablet for vapor deposition was obtained in the same manner as in Example 1, except that the ratio of the calcined powder was 50% by weight. Hrer, the calcination temperature was 1500° C., and the sintering temperature was 1300° C. The obtained ICO sintered body tablet for vapor deposition had a relative density of 56.3%. No cracking of the tablet was observed during the EB deposition.

The transparent conductive film had the same composition as that of the tablet. In addition, predetermined film qualities were successfully obtained without any major change in film formation conditions during the production.

Example 4

An ICO sintered body tablet for vapor deposition was obtained in the same manner as in Example 1, except that the sintering temperature was 1200° C. Here, the calcination temperature was 1500° C., and the ratio of the calcined powder was 80% by weight. The obtained ICO sintered body tablet for vapor deposition had a relative density of 53.3%. No cracking of the tablet was observed during the EB deposition. The transparent conductive film had the same composition as that of the tablet. In addition, predetermined film qualities were successfully obtained without any major change in film formation conditions during the production.

Example 5

An ICO sintered body tablet for vapor deposition was obtained in the same manner as in Example 1, except that the calcination temperature was 1400° C., and the sintering temperature was 1200° C. Here, the ratio of the calcined powder was 80% by weight. The obtained ICO sintered body tablet for vapor deposition had a relative density of 53.9%. No cracking of the tablet was observed during the EB deposition. The transparent conductive film had the same composition as that of the tablet. In addition, predetermined film qualities were successfully obtained without any major change in film formation conditions during the production.

Example 6

An ICO sintered body tablet for vapor deposition was obtained in the same manner as in Example 1, except that the calcination temperature was 1400° C., the sintering temperature was 1200° C., and the ratio of the calcined powder was 50% by weight. The obtained ICO sintered body tablet for vapor deposition had a relative density of 58.0%. No cracking of the tablet was observed during the EB deposition. The transparent conductive film had the same composition as that of the tablet. In addition, predetermined film qualities were successfully obtained without any major change in film formation conditions during the production.

Example 7

An ICO sintered body was obtained in the same manner as in Example 1, except that the calcination temperature was 1400° C., and the sintering temperature was 1100° C. Here, the ratio of the calcined powder was 80% by weight. The sintered body had a relative density of 53.5%. No cracking of the tablet was observed during the EB deposition. The transparent conductive film had the same composition as that of the tablet. In addition, predetermined film qualities were successfully obtained without any major change in film formation conditions during the production.

Example 8

An ICO sintered body tablet for vapor deposition was obtained in the same manner as in Example 1, except that the calcination temperature was 1300° C., and the sintering temperature was 1100° C. Here, the ratio of the calcined powder was 80% by weight. The obtained ICO sintered body tablet for vapor deposition had a relative density of 54.3%. No cracking of the tablet was observed during the EB deposition. The transparent conductive film had the same composition as that of the tablet. In addition, predetermined film qualities were successfully obtained without any major change in film formation conditions during the production.

Example 9

An ICO sintered body tablet for vapor deposition was obtained in the same manner as in Example 1, except that the calcination temperature was 1550° C., and the sintering temperature was 1350° C. Here, the ratio of the calcined powder was 80% by weight. The obtained ICO sintered body tablet for vapor deposition had a relative density of 53.4%. No cracking of the tablet was observed during the EB deposition. The transparent conductive film had the same composition as that of the tablet. In addition, predetermined film qualities were successfully obtained without any major change in film formation conditions during the production.

Example 10

An ICO sintered body tablet for vapor deposition was obtained in the same manner as in Example 1, except that the calcination temperature was 1550° C., and the sintering temperature was 1100° C. Here, the ratio of the calcined powder was 80% by weight. The obtained ICO sintered body tablet for vapor deposition had a relative density of 51.6%. No cracking of the tablet was observed during the EB deposition. The transparent conductive film had the same composition as that of the tablet. In addition, predetermined film qualities were successfully obtained without any major change in film formation conditions during the production.

Example 11

An ICO sintered body tablet for vapor deposition was obtained in the same manner as in Example 1, except that the blending was conducted such that the cerium oxide contents in the uncalcined powder and the calcined powder were both 1% by weight. Here, the calcination temperature was 1500° C., the sintering temperature was 1300° C., and the ratio of the calcined powder was 80% by weight. The obtained ICO sintered body tablet for vapor deposition had a relative density of 54.2%. No cracking of the tablet was observed during the EB deposition. The transparent conductive film had the same composition as that of the tablet. In addition, predetermined film qualities were successfully obtained without any major change in film formation conditions during the production.

Example 12

An ICO sintered body tablet for vapor deposition was obtained in the same manner as in Example 1, except that the blending was conducted such that the cerium oxide contents in the uncalcined powder and the calcined powder were both 30% by weight. Here, the calcination temperature was 1500° C., the sintering temperature was 1300° C., and the ratio of the calcined powder was 80% by weight. The obtained ICO sintered body tablet for vapor deposition had a relative density of 53.2%. No cracking of the tablet was observed during the EB deposition. The transparent conductive film had the same composition as that of the tablet. In addition, predetermined film qualities were successfully obtained without any major change in film formation conditions during the production.

Example 13

An ICO sintered body tablet for vapor deposition was obtained in the same manner as in Example 1, except that the calcination temperature was 1400° C., the sintering temperature was 1200° C., and the ratio of the calcined powder was 40% by weight. The obtained ICO sintered body tablet for vapor deposition had a relative density of 65.4%. No cracking of the tablet was observed during the EB deposition. The transparent conductive film had the same composition as that of the tablet. In addition, predetermined film qualities were successfully obtained without any major change in film formation conditions during the production.

Example 14

An ICO sintered body tablet for vapor deposition was obtained in the same manner as in Example 1, except that the ratio of a calcined powder prepared from an indium oxide powder alone at a calcination temperature of 1500° C. was 80% by weight, and an uncalcined powder obtained by blending a cerium oxide powder with an indium oxide powder such that the cerium oxide content was 50% by weight was 20% by weight. The obtained ICO sintered body tablet for vapor deposition had a relative density of 53.4%. No cracking of the tablet was observed during the EB deposition. The transparent conductive film had the same composition as that of the tablet. In addition, predetermined film qualities were successfully obtained without any major change in film formation conditions during the production.

Example 15

An ICO sintered body tablet for vapor deposition was obtained in the same manner as in Example 1, except that the ratio of a calcined powder prepared from a powder obtained by blending a cerium oxide powder with an indium oxide powder such that the cerium oxide content was 12.5% by weight at a calcination temperature of 1500° C. was 80% by weight, and 20% by weight of a powder containing an indium oxide powder alone was employed as the uncalcined powder. The obtained ICO sintered body tablet for vapor deposition had a relative density of 53.6%. No cracking of the tablet was observed during the EB deposition. The transparent conductive film had the same composition as that of the tablet. In addition, predetermined film qualities were successfully obtained without any major change in film formation conditions during the production.

Comparative Example 1

An ICO sintered body tablet for vapor deposition was obtained in the same manner as in Example 1, except that the sintering temperature was 1400° C. Here, the calcination temperature was 1500° C., and the ratio of the calcined powder was 80% by weight. The obtained ICO sintered body tablet for vapor deposition had a relative density of 55.5%. Cracking of the tablet occurred during the EB deposition. The obtained transparent conductive film had the same composition as that of the tablet. Major change in film formation conditions was required during the production.

Comparative Example 2

An ICO sintered body tablet for vapor deposition was obtained in the same manner as in Example 1, except that the calcination temperature was 1550° C., and the sintering temperature was 1400° C. Here, the ratio of the calcined powder was 80% by weight. The obtained ICO sintered body tablet for vapor deposition had a relative density of 53.9%. Cracking of the tablet occurred during the EB deposition. The obtained transparent conductive film had the same composition as that of the tablet. Major change in film formation conditions was required during the production.

Comparative Example 3

An ICO sintered body tablet for vapor deposition was obtained in the same manner as in Example 1, except that the calcination temperature was 1400° C., and the sintering temperature was 1400° C. Here, the ratio of the calcined powder was 80% by weight. The obtained ICO sintered body tablet for vapor deposition had a relative density of 54.0%. Cracking of the tablet occurred during the EB deposition. The obtained transparent conductive film had the same composition as that of the tablet. Major change in film formation conditions was required during the production.

Comparative Example 4

An ICO sintered body was obtained in the same manner as in Example 1, except that the calcination temperature was 1400° C., the sintering temperature was 1400° C., and the ratio of the calcined powder was 50% by weight. The sintered body had a relative density of 60.5%. Cracking of the tablet occurred during the EB deposition. The obtained transparent conductive film had the same composition as that of the tablet. Major change in film formation conditions was required during the production.

Comparative Example 5

An ICO sintered body tablet for vapor deposition was obtained in the same manner as in Example 1, except that the calcination temperature was 1400° C., and the ratio of the calcined powder was 60% by weight. Here, the sintering temperature was 1300° C. The obtained ICO sintered body tablet for vapor deposition had a relative density of 57.1%. Cracking of the tablet occurred during the EB deposition. The obtained transparent conductive film had the same composition as that of the tablet. Major change in film formation conditions was required during the production.

Comparative Example 6

An ICO sintered body tablet for vapor deposition was obtained in the same manner as in Example 1, except that the calcination temperature was 1300° C. Here, the sintering temperature was 1300° C., and the ratio of the calcined powder was 80% by weight. The obtained ICO sintered body tablet for vapor deposition had a relative density of 55.0%. Cracking of the tablet occurred during the EB deposition. The obtained transparent conductive film had the same composition as that of the tablet. Major change in film formation conditions was required during the production.

Figure 4:
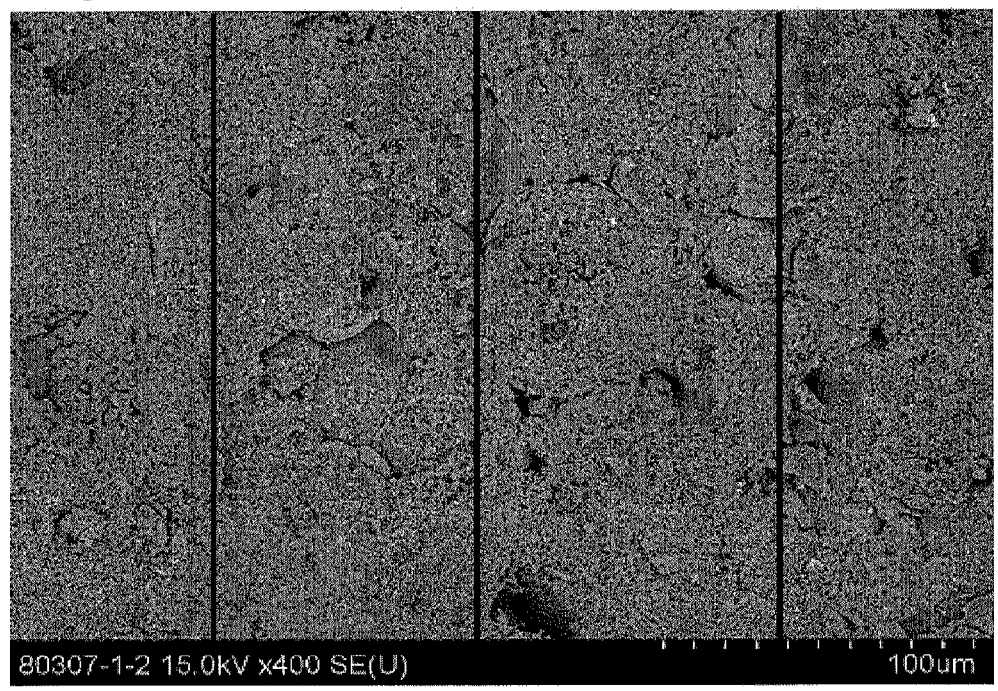
FIG. 4 is a SEM (scanning electron microscope) image of a fracture surface of an ICO sintered body tablet for vapor deposition according to Comparative Example 6.

Note that, for reference, a SEM image of a fracture surface of an ICO sintered body tablet for observation according to Comparative Example 6 (the same as the ICO sintered body tablet for vapor deposition according to Comparative Example 6) is shown in FIG. 4.

Comparative Example 7

An ICO sintered body tablet for vapor deposition was obtained in the same manner as in Example 1, except that the calcination temperature was 1300° C., and the sintering temperature was 1400° C. Here, the ratio of the calcined powder was 80% by weight. The obtained ICO sintered body tablet for vapor deposition had a relative density of 55.7%. Cracking of the tablet occurred during the EB deposition. The obtained transparent conductive film had the same composition as that of the tablet. Major change in film formation conditions was required during the production.

Comparative Example 8

An ICO sintered body tablet for vapor deposition was obtained in the same manner as in Example 1, except that the calcination temperature was 1400° C., and the sintering temperature was 1550° C. Here, the ratio of the calcined powder was 80% by weight. The obtained ICO sintered body tablet for vapor deposition had a relative density of 53.8%. Cracking of the tablet occurred during the EB deposition. The obtained transparent conductive film had the same composition as that of the tablet. Major change in film formation conditions was required during production.

Figure 5:
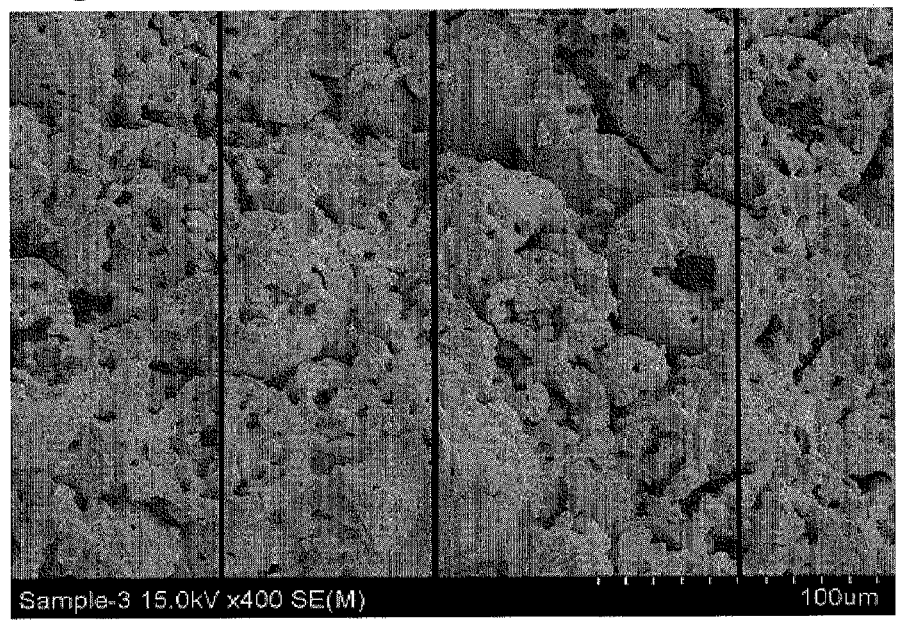
FIG. 5 is a SEM (scanning electron microscope) image of a fracture surface of an ICO sintered body tablet for vapor deposition according to Comparative Example 8.

Note that, for reference, a SEM image of a fracture surface of an ICO sintered body tablet for observation according to Comparative Example 8 (the same as the ICO sintered body tablet for vapor deposition according to Comparative Example 8) is shown in FIG. 5.

[Observations]

Figure 1:
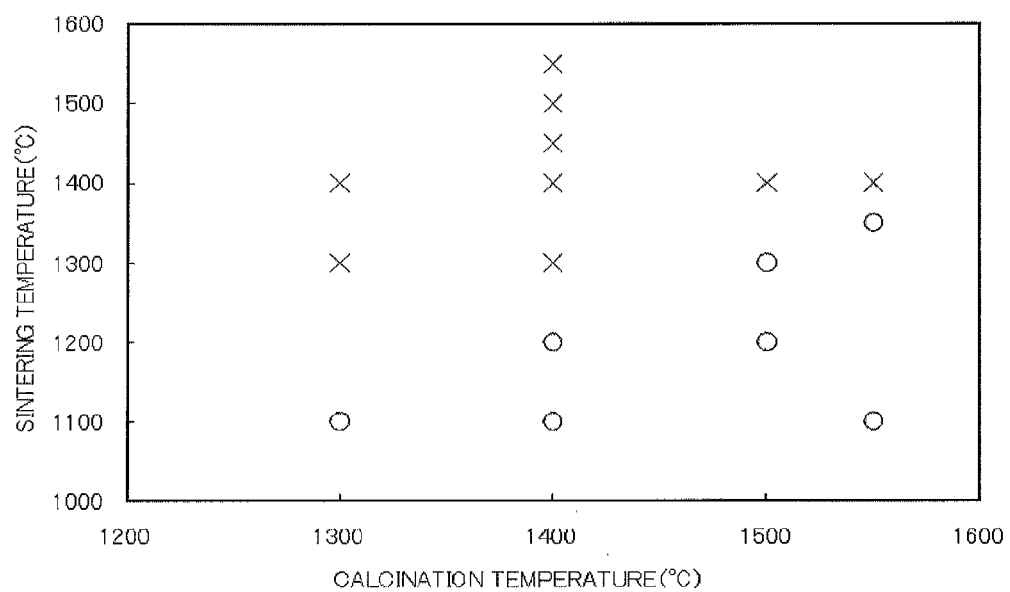
FIG. 1 is a graph showing the presence or absence of cracks in ICO sintered body tablets which were produced under calcination temperature conditions for obtaining calcined powders and sintering temperature conditions for obtaining ICO sintered bodies and which were used for electron beam (EB) deposition (○ indicates a tablet with no crack, and x indicates a tablet with a crack).

(1) As can be seen from the column "Crack after EB deposition" in Table 1 and the graph (○ marks) in FIG. 1, it was observed that no tablet cracking occurred during the EB deposition in the ICO sintered body tablets for vapor deposition according to Examples 1 to 15, each of which was produced under the "sintering temperature" condition which was lower than the "calcination temperature" condition for obtaining the calcined powder by 200° C. or more, and has a "relative density" of 50% to 80%, both inclusive.

Figure 6:
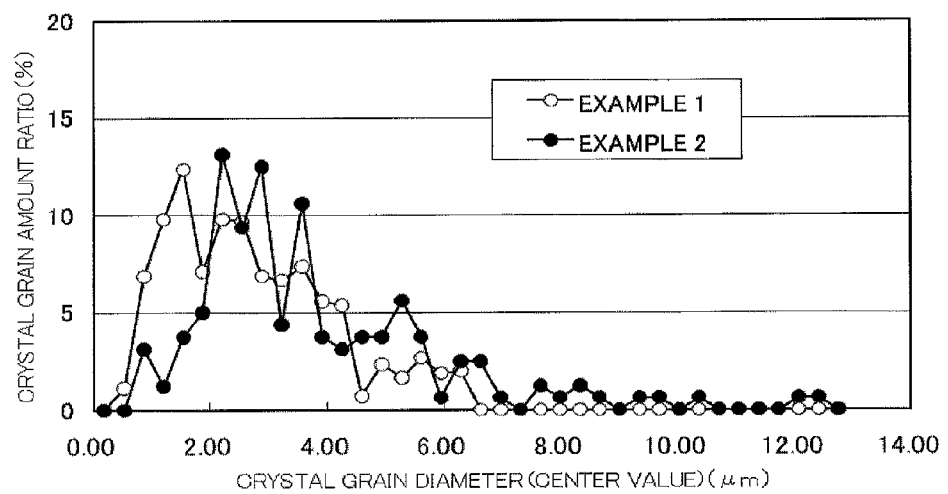
FIG. 6 is a graph showing the relationship between the crystal grain diameter (center value) (μm) and the crystal grain amount ratio (%) determined from the SEM images of the fracture surfaces of the ICO sintered body tablets for vapor deposition according to Examples 1 and 2.

(2) In addition, the graph in FIG. 6 shows the relationship between the crystal grain diameter (center value) (μm) and the crystal grain amount ratio (%) determined from each of the SEM images of the fracture surfaces of the ICO sintered body tablets for vapor deposition according to Examples 1 and 2 (the same as the ICO sintered body tablets for observation according to Examples 1 and 2). It was observed that the "most frequent crystal grain percentage" was 20% or less for each of the ICO sintered body tablets for vapor deposition according to Examples 1 and 2. Moreover, as can be also seen from the column "most frequent crystal grain percentage" in Table 1, it was observed that all the "most frequent crystal grain percentages" were 20% or less for the ICO sintered body tablets for vapor deposition according to Examples 1 to 15, where no cracking of the tablets occurred during the EB deposition.

TABLE 1

| Example: | Cerium oxide conc. (wt %) | Calcination temp. (° C.) | Ratio of calcined powder (%) | Cerium oxide conc. in calcined powder (wt %) | Sintering temp. (° C.) | Temp. difference (° C.) | Relative density (%) | Crack after EB deposition | Most frequent crystal grain percentage (%) |
|---|---|---|---|---|---|---|---|---|---|
| 1 | 10 | 1500 | 80 | 10 | 1300 | 200 | 53.5 | Absent | 12.4 |
| 2 | 10 | 1500 | 60 | 10 | 1300 | 200 | 55.4 | Absent | 13.1 |
| 3 | 10 | 1500 | 50 | 10 | 1300 | 200 | 56.3 | Absent | 11.5 |
| 4 | 10 | 1500 | 80 | 10 | 1200 | 300 | 53.3 | Absent | 8.4 |
| 5 | 10 | 1400 | 80 | 10 | 1200 | 200 | 53.9 | Absent | 18.2 |
| 6 | 10 | 1400 | 50 | 10 | 1200 | 200 | 58.0 | Absent | 19.5 |
| 7 | 10 | 1400 | 80 | 10 | 1100 | 300 | 53.5 | Absent | 15.8 |
| 8 | 10 | 1300 | 80 | 10 | 1100 | 200 | 54.3 | Absent | 17.4 |
| 9 | 10 | 1550 | 80 | 10 | 1350 | 200 | 53.4 | Absent | 12.4 |
| 10 | 10 | 1550 | 80 | 10 | 1100 | 450 | 51.6 | Absent | 7.8 |
| 11 | 1 | 1500 | 80 | 1 | 1300 | 200 | 54.2 | Absent | 12.2 |
| 12 | 30 | 1500 | 80 | 30 | 1300 | 200 | 53.2 | Absent | 11.9 |
| 13 | 10 | 1400 | 40 | 10 | 1200 | 200 | 65.4 | Absent | 17.2 |
| 14 | 10 | 1500 | 80 | 0 | 1300 | 200 | 53.4 | Absent | 12.3 |
| 15 | 10 | 1500 | 80 | 12.5 | 1300 | 200 | 53.6 | Absent | 12.0 |

TABLE 2

| Comparative Example: | Cerium oxide conc. (wt %) | Calcination temp. (° C.) | Ratio of calcined powder (%) | Cerium oxide conc. in calcined powder (wt %) | Sintering temp. (° C.) | Temp. difference (° C.) | Relative density (%) | Crack after EB deposition | Most frequent crystal grain percentage (%) |
|---|---|---|---|---|---|---|---|---|---|
| 1 | 10 | 1500 | 80 | 10 | 1400 | 100 | 55.5 | Present | 21.1 |
| 2 | 10 | 1550 | 80 | 10 | 1400 | 150 | 53.9 | Present | 20.9 |
| 3 | 10 | 1400 | 80 | 10 | 1400 | 0 | 54.0 | Present | 24.6 |
| 4 | 10 | 1400 | 50 | 10 | 1400 | 0 | 60.5 | Present | 21.0 |
| 5 | 10 | 1400 | 60 | 10 | 1300 | 100 | 57.1 | Present | 24.5 |
| 6 | 10 | 1300 | 80 | 10 | 1300 | 0 | 55.0 | Present | 39.8 |
| 7 | 10 | 1300 | 80 | 10 | 1400 | −100 | 55.7 | Present | 30.9 |
| 8 | 10 | 1400 | 80 | 10 | 1550 | −150 | 53.8 | Present | 22.4 |

(3) On the other hand, as can be seen from the column "Crack after EB deposition" in Table 2 and the graph (x marks) in FIG. 1, it was observed that tablet cracking occurred during the EB deposition in the ICO sintered body tablets for vapor deposition according to Comparative Examples 1, 2, and 5, each of which was produced under the "sintering temperature" condition which was lower than the "calcination temperature" condition for obtaining the calcined powder by 100° C. to 150° C., and had a "relative density" of 50% to 80%, both inclusive, the ICO sintered body tablets for vapor deposition according to Comparative Examples 3, 4, and 6, each of which was produced under the "sintering temperature" condition which was the same as the "calcination temperature" condition, and had a "relative density" of 50% to 80%, both inclusive, the ICO sintered body tablets for vapor deposition according to Comparative Examples 7 and 8, each of which was produced under the "sintering temperature" condition which was higher than the "calcination temperature" condition by 100° C. or 150° C., and had a "relative density" of 50% to 80%, both inclusive, and the like.

Figure 7:
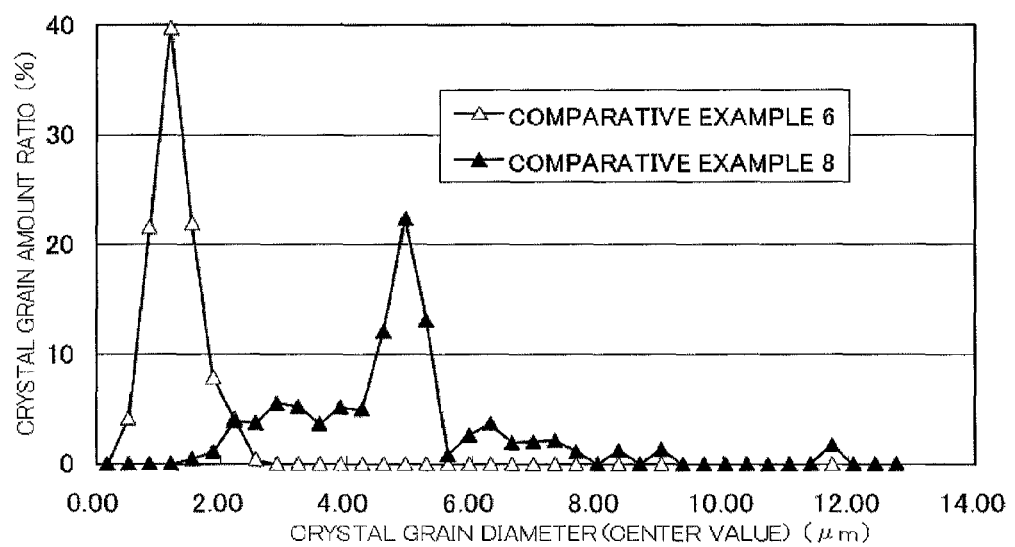
FIG. 7 is a graph showing the relationship between the crystal grain diameter (center value) (μm) and the crystal grain amount ratio (%) determined form the SEM images of the fracture surfaces of the ICO sintered body tablets for vapor deposition according to Comparative Examples 6 and 8.

(4) In addition, the graph in FIG. 7 shows the relationship between the crystal grain diameter (center value) (μm) and the crystal grain amount ratio (%) determined from each of the SEM images of the fracture surfaces of the ICO sintered body tablets for vapor deposition according to Comparative Examples 6 and 8 (the same as the ICO sintered body tablets for observation according to Comparative Examples 6 and 8). It was observed that the "most frequent crystal grain percentage" exceeded 20% for each of the ICO sintered body tablets for vapor deposition according to Comparative Examples 6 and 8. Moreover, as can be seen from the column "Most frequent crystal grain percentage" in Table 2, it was observed that all the "most frequent crystal grain percentages" exceeded 20% for the ICO sintered body tablets for vapor deposition according to Comparative Examples 1 to 8, where cracking of the tablets occurred during the EB deposition.

POSSIBILITY OF INDUSTRIAL APPLICATION

The ICO sintered body tablet for vapor deposition according to the present invention produced by the method under the above-described conditions is not easily broken even by irradiation with high-power electron beams. Hence, the ICO sintered body tablet for vapor deposition according to the present invention is industrially applicable as an ICO sintered body tablet for vapor deposition for producing a high-refractive-index transparent conductive film having a refractive index as high as 2.0 to 2.2.

The invention claimed is:

1. A tablet for vapor deposition which is made of an indium oxide sintered body containing cerium as a dopant, and which has a relative density of 50% to 80%, both inclusive, the tablet for vapor deposition characterized in that crystal grains appearing on a fracture surface of the indium oxide sintered body have such a distribution of crystal grain amounts that the percentage (most frequent crystal grain percentage) due to crystal grains having a grain diameter corresponding to a highest peak is 20% or less, each of the crystal grain amounts being obtained by multiplying the number of crystal grains by a grain diameter of the crystal grains, wherein the "most frequent crystal grain percentage" is determined for the fracture surface of the indium oxide sintered body through the following steps (1) to (5):

(1) drawing three parallel straight lines at any positions on a SEM image of the fracture surface of the indium oxide sintered body, and measuring lengths defined by grain boundary portions of crystal grains positioned on the three straight lines as "grain diameters (crystal grain diameters) of the crystal grains";

(2) sectioning the range of the measured grain diameters (crystal grain diameters) at intervals of 0.34 μm, and counting "the number of crystal grains" in each of the sections divided at the 0.34-μm intervals;

(3) with the "center value" of each of the sections being used as a representative value of the "grain diameters (crystal grain diameters) of the crystal grains" in the section, defining a value obtained by multiplying the "number of crystal grains" by the "crystal grain diameter (center value)" as a "crystal grain amount";

(4) then, determining the "crystal grain amount" for each of the sections, and calculating the percentage of each of the "crystal grain amounts" relative to the total of the "crystal grain amounts"; and (5) with a peak having the maximum value among the calculated percentages being defined as the "highest peak," determining the percentage due to the crystal grains having the grain diameter corresponding to the highest peak as the "most frequent crystal grain percentage".

2. A method for producing the tablet for vapor deposition according to claim 1, which is made of the indium oxide sintered body containing cerium as the dopant, and which has the relative density of 50% to 80%, both inclusive, the method characterized by comprising:

a first step of obtaining a calcined powder by subjecting an indium oxide powder to a heat treatment at 1300° C. or above and 1550° C. or below;

a second step of obtaining a granulated powder by mixing an uncalcined cerium oxide powder or an uncalcined indium oxide powder and an uncalcined cerium oxide powder with the obtained calcined powder such that the ratio of the calcined powder is 50% by mass to 80% by mass, both inclusive, followed by granulation; and a third step of obtaining the indium oxide sintered body containing cerium as the dopant by molding the obtained granulated powder, thereby forming a molded body, and then sintering the molded body at a temperature which is 1100° C. or above and 1350° C. or below, and which is lower than the temperature of the heat treatment on the calcined powder in the first step by 200° C. or more.

3. A method for producing the tablet for vapor deposition according to claim 1, which is made of the indium oxide sintered body containing cerium as the dopant, and which has the relative density of 50% to 80%, both inclusive, the method characterized by comprising:

a first step of obtaining a calcined powder by subjecting an indium oxide powder and a cerium oxide powder to a heat treatment at 1300° C. or above and 1550° C. or below;

a second step of obtaining a granulated powder by mixing an uncalcined indium oxide powder and/or an uncalcined cerium oxide powder with the obtained calcined powder such that the ratio of the calcined powder is 50% by mass to 80% by mass, both inclusive, followed by granulation; and a third step of obtaining the indium oxide sintered body containing cerium as the dopant by molding the obtained granulated powder, thereby forming a molded body, and then sintering the molded body at a temperature which is 1100° C. or above and 1350° C. or below, and which is lower than the temperature of the heat treatment on the calcined powder in the first step by 200° C. or more.

4. The method for producing a tablet for vapor deposition according to claim 2, characterized in that in the first step, the calcined powder is obtained by performing the heat treatment at 1400° C. or above and 1500° C. or below.

5. The method for producing a tablet for vapor deposition according to claim 2, characterized in that in the first step, the calcined powder is obtained by performing the heat treatment for 15 hours or more.

6. The method for producing a tablet for vapor deposition according to claim 2, characterized in that in the second step, the ratio of the calcined powder is 70% by mass to 80% by mass, both inclusive.

7. The method for producing a tablet for vapor deposition according to claim 2, characterized in that in the third step, an atmosphere during the sintering is an air atmosphere.

8. The method for producing a tablet for vapor deposition according to claim 2, characterized in that in the third step, a holding time for which the temperature for the sintering is held after the temperature for the sintering is reached is 15 hours to 25 hours, both inclusive.

9. The method for producing a tablet for vapor deposition according to claim 3, characterized in that in the first step, the calcined powder is obtained by performing the heat treatment at 1400° C. or above and 1500° C. or below.

10. The method for producing a tablet for vapor deposition according to claim 3, characterized in that in the first step, the calcined powder is obtained by performing the heat treatment for 15 hours or more.

11. The method for producing a tablet for vapor deposition according to claim 3, characterized in that in the second step, the ratio of the calcined powder is 70% by mass to 80% by mass, both inclusive.

12. The method for producing a tablet for vapor deposition according to claim 3, characterized in that in the third step, an atmosphere during the sintering is an air atmosphere.

13. The method for producing a tablet for vapor deposition according to claim 3, characterized in that in the third step, a holding time for which the temperature for the sintering is held after the temperature for the sintering is reached is 15 hours to 25 hours, both inclusive.

\* \* \* \* \*